(12) United States Patent
Ward et al.

(10) Patent No.: US 10,741,094 B2
(45) Date of Patent: Aug. 11, 2020

(54) HIGH VOLTAGE TRAINING DEVICE AND SYSTEM AND METHOD THEREOF

(71) Applicant: Timpson Electrical & Aerial Services, LLC, Port Deposit, MD (US)

(72) Inventors: Robert J. Ward, Port Deposit, MD (US); Caleb R. Thompson, Port Deposit, MD (US); Brian L. Timmons, Millington, MD (US)

(73) Assignee: Timpson Electrical & Aerial Services, LLC, Port Deposit, MD (US)

( * ) Notice: Subject to any disclaimer, the term of this patent is extended or adjusted under 35 U.S.C. 154(b) by 415 days.

(21) Appl. No.: 15/639,711

(22) Filed: Jun. 30, 2017

(65) Prior Publication Data
US 2018/0005542 A1    Jan. 4, 2018

Related U.S. Application Data

(60) Provisional application No. 62/356,740, filed on Jun. 30, 2016.

(51) Int. Cl.
| | |
|---|---|
| *G09B 9/00* | (2006.01) |
| *G09B 23/18* | (2006.01) |
| *G01R 19/25* | (2006.01) |
| *G01R 19/165* | (2006.01) |
| *G09B 5/04* | (2006.01) |

(52) U.S. Cl.
CPC ......... *G09B 9/00* (2013.01); *G01R 19/16538* (2013.01); *G01R 19/2513* (2013.01); *G09B 5/04* (2013.01); *G09B 23/181* (2013.01)

(58) Field of Classification Search
USPC ...................................................... 434/224
See application file for complete search history.

(56) References Cited

U.S. PATENT DOCUMENTS

| | | | |
|---|---|---|---|
| 5,363,035 | A | 11/1994 | Hutchison |
| 6,445,196 | B1 | 9/2002 | White |
| 6,657,435 | B2 | 12/2003 | Brown |

(Continued)

FOREIGN PATENT DOCUMENTS

CN    103440803 B    2/2016

OTHER PUBLICATIONS

Weidmuller, SAFESERIES SIL Relays. 2004 Retrieved from the Internet www.clrwtr.com/PDF/Weidmuller-SAFESERIES-SIL3-Relay.pdf.

(Continued)

*Primary Examiner* — Kesha Frisby
(74) *Attorney, Agent, or Firm* — Richard P. Gilly, Esq.; Gregory J. Winsky, Esq.

(57) ABSTRACT

A high voltage training system is provided comprising a high voltage training device in connection with one or more energized lines, and configured to detect a trigger event involving the interaction of a user with the energized lines, modulating/regulating current output in response, and engage one or more of an alert from an alert system, whereby the training system aids in the behavioral modification of the user in a training scenario. A trigger event comprises an event occurring between a user and the energized lines, or contact between a grounding conductor and the energized lines. An alert comprises one or more of an audible alarm, a visual indicator of alarm, or an electrical current (of less than 20 mA) emitted from the energized lines and contacted with the skin of the trainee engaged with the training system.

20 Claims, 6 Drawing Sheets

(56) References Cited

U.S. PATENT DOCUMENTS

2006/0108871 A1    5/2006   Wimmer
2009/0029325 A1    1/2009   Hetherington et al.
2011/0133763 A1    6/2011   Schulte et al.
2011/0207097 A1    8/2011   Lumry et al.
2013/0171606 A1    7/2013   Seymour

OTHER PUBLICATIONS

International Search Report and Written Opinion dated Sep. 25, 2017.

HIGH VOLTAGE TRAINING DEVICE AND SYSTEM AND METHOD THEREOF

CROSS REFERENCE TO RELATED APPLICATIONS

This application claims priority to U.S. provisional patent Application No. 62/356,740 filed on Jun. 30, 2016, the content of which is hereby incorporated by reference in its entirety.

BACKGROUND

Training of electricians and line workers currently involves training sessions carried out in training yards with the yard voltage in the de-energized state, or alternatively in the full voltage/current state—both of which are considered unsafe training conditions that lead to serious or fatal injuries to workers.

SUMMARY OF THE INVENTION

Disclosed herein is a high-voltage training system and device configured to safely train electrical workers (linemen, power line technicians (PLTs), or power line workers) for engaging with high voltage power lines, without risk of serious and/or fatal injuries to the trainees. The high-voltage training system and device of the present invention provides "hands-on" and "real life" training for electrical workers, so that trainees can develop the necessary skills needed—both behavioral and technical—to perform their duties in the field.

Electrical workers perform their work under dangerous conditions, routinely with electrical wires of high voltage (up to 35,000 V). Training a worker for such hazardous situations generally involves providing simulated training opportunities, replicating what may be seen in the field, in order to hone skills needed on the job. Behavioral training is key to bring a heightened awareness of the hazardous nature of the work, and instill good habits in trainees, through repeated exposure to real-world situations that trainees will encounter in the field. A key benefit of the high voltage training device and system disclosed herein is the safe environment for technical and behavioral training of electrical workers.

Common training scenarios utilize a de-energized state, which can lead to a false sense of security in an otherwise dangerous situation. For example, if a trainee reaches for a line that would otherwise be an energized line, they fail to establish an awareness of the environment and the proper skills necessary to navigate that environment. Utilizing the high voltage training system of the present invention, however, allows increased awareness and acclimation to surroundings because the system operates in a "real life" energized state, monitors the energized circuit and detects a trigger event, such as when a trainee contacts an energized line, and provides a safety alert in response. This detection and response mechanism has the benefit of instilling safe work practices for not only the trainees working on the line, but for others in their crew or near the electrical wires.

In one aspect of the invention, provided is a high voltage training system and device configured to detect an increase or decrease in current in a yard circuit indicating a trigger event, such as contact between a trainee and an energized line in the yard circuit, and engage a safety relay and alarm in response.

In another aspect, the system comprises a yard circuit capable of being energized by a high voltage training device comprising a current-limiting transformer, a controller in communication with each of a current transducer, voltage transducer, safety relay and alarm system. One or more automation program modules may reside with the controller, and may be downloaded via a portable electronic device, such as a computer (for example, a laptop) or a computing device (such as a tablet or smartphone) connected over a wireless network or a hard wire for connection with the controller.

BRIEF DESCRIPTION OF THE FIGURES

The foregoing and other aspects, features, details, utilities, and advantages of the present invention will be apparent, in addition, by the accompanying drawings, in which.

DETAILED DESCRIPTION OF THE INVENTION

Figure 1:
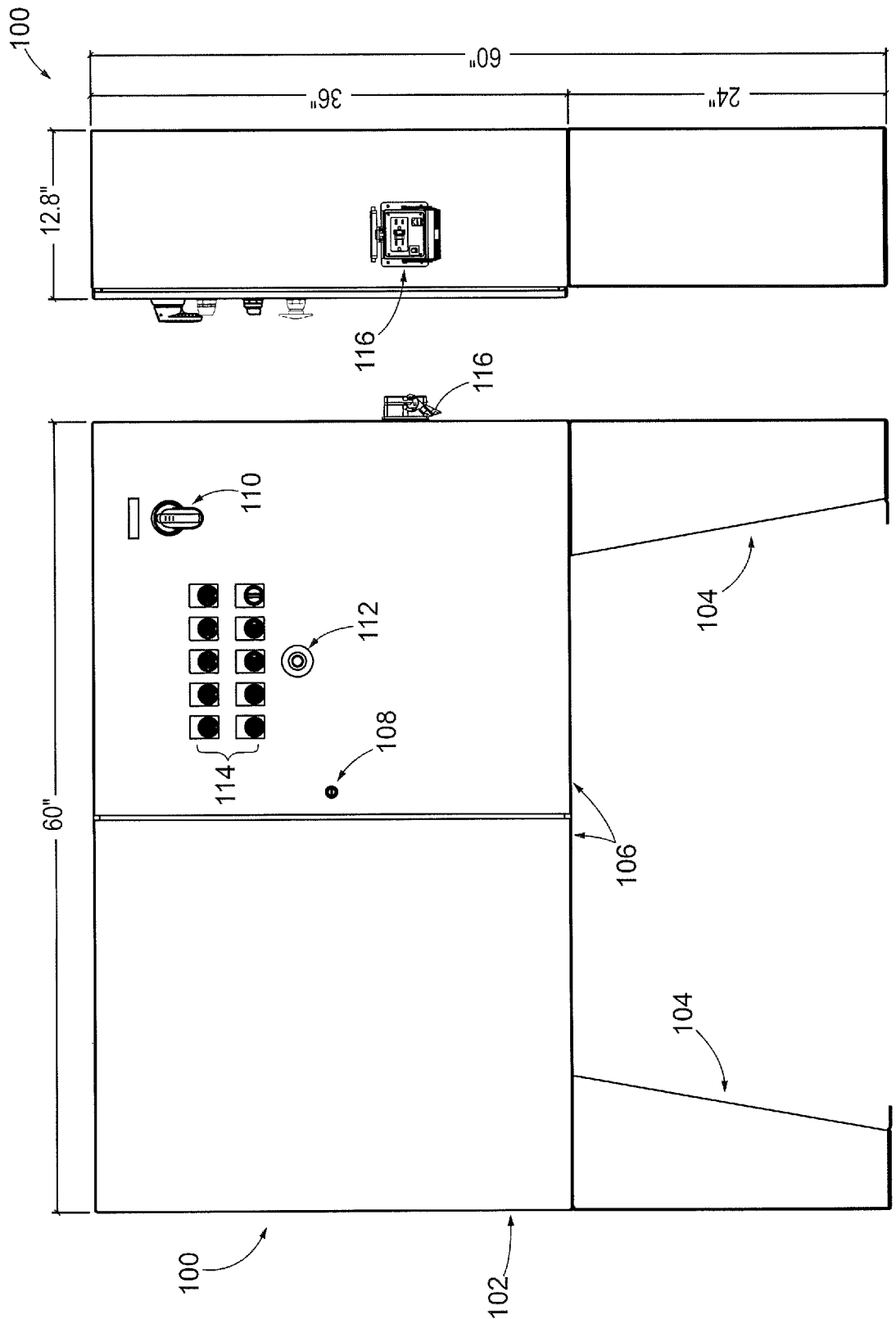
FIG. 1 shows an overview of a high voltage training device according to one embodiment of the invention.

In one possible implementation of this disclosure, a high-voltage training system includes a training yard circuit which upon energizing, has an associated or an excitation current. In one suitable implementation, the training yard circuit has an excitation current which generally is less than 50 milliamps. Excitation (or initial) current when the training yard is energized will depend on the components and configurations of the circuit. In some applications, excitation or initial current may range from 1 milliamp to 25 milliamps, or from 5 milliamps to 20 milliamps. Still other amperages are possible. The amperage may be less than operational current normally associated with high-voltage lines by a sufficient amount to reduce risk of injury to trainees when energized and in use for training.

The training system includes the following components: a safety relay, a current transducer, and a current-limiting transformer, the foregoing components being electrically connected in series in the training yard circuit. Multiple components may be arranged in series or in parallel depending on the configuration of the training circuit and number of phases in such circuit.

A controller, such as a programmable logic controller (PLC), has been suitably programmed to receive input including feedback signals, from either the current transducer or the safety relay (or both). The controller also is configured to provide output, such as actuation signals, to the safety relay, in response to the controller receiving input corresponding to certain conditions, as explained subsequently.

The current transducer generates a real-time signal corresponding to the actual current in the training yard. The controller receives this actual current signal and compares it to a threshold current value which the controller generated by adding the excitation current of the training yard to a trip current value.

The controller is programmed so that it is capable of determining if the actual current exceeds the threshold current. It is also able to determine if the controller loses logical or operational connection with either the current transducer or the safety relay. In the case of exceeding the threshold current or losing connection to the safety relay or transducer, the controller is able to cause the safety relay to shut down or de-activate, a state in which the safety relay causes the yard circuit to de-energize. Instances of the actual current exceeding the threshold current (which would lead to de-energizing the yard circuit) are generally associated with actions by linesmen trainees which would have otherwise resulted in bodily injury if such actions were undertaken outside the training yard in actual high-voltage field applications. In one mode of operation, then, actual current in the yard training circuit may exceed the threshold current when the trainee's actions erroneously and accidentally produce faults (such as contacting energized wires when grounded), resulting in the controller de-energizing the yard.

In one suitable variation of the above implementation, the current transducer generates its actual current signal to an accuracy of one-one-hundredth of a milliampere. In such variation, the controller is programmed to compare the actual current signal to the threshold current value at intervals not to exceed 10 milliseconds. In still other implementations, the transformer limits current to 60 milliamperes and the controller is able to cause de-actuation of the safety relay (de-energizing the training yard) within 120 milliseconds of a determination that actual current exceeded the threshold current.

The controller described herein may, in various implementations, comprise a PLC. In certain implementation, the PLC may include an automation program module resident in the PLC. In still further implementations, the controller in the high-voltage training system include programming instructions downloadable from a server to a portable client electronic device, such as a computer, a tablet, or a smartphone.

In one implementation, the PLC can be configured to interface with up to nine training yard circuits. A single PLC for multiple circuits may be used in different implementations, and circuits may have differing voltages. In one implementation, there may be three circuits having respective voltages of 7200V, 4160V, and 15 kV.

The purpose of the foregoing system is to provide feedback or output to linesman trainees, especially beneficial when inadvertent contact with an energized line occurs during a training exercise. One aspect of such feedback is for the controller to cause an audible alarm to sound upon determination of an instance or event that results in de-energizing of the yard training circuit. In other aspects, the instance which caused the alarm or de-energized state of the yard is logged as a retrievable record in a suitable digital memory associated with the controller, which may be stored in a system database or transferrable over a network to a database.

Although other suitable applications may have different values, in one possible implementation, the current-limiting transformer generates a voltage of 7200 volts in the yard training circuit, with the excitation current being less than 50 milliamperes. The yard training system reduces linesman trainee's accidental exposure to electricity from the yard training circuit when energized. In one possible implementation, inadvertent electrical exposure when using the yard training system does not exceed 20 milliamps and such electricity shall not be present beyond 120 milliseconds. One skilled in the art will understand that such values will minimize the risk of any potential harm, and are exemplary. Other values may likewise be suitable are intended to be adaptable to training yards of varying configurations (size and circuits). As such, the system as described in this disclosure merely simulates a high-voltage field application, and because of the components described herein, the electrical exposure by the lineman is limited as the controller actuates the safety relay within a short time frame, as exemplified above.

The system of the present invention, in certain implementations, may comprise a three-phase system. In such system, there will be one (1) current limiting transducer for each of the three (3) phases, and one current-limiting transformer for each of the three phases. The current limiting transformer limits the current to 60 milliamps by means of a shunt, such as a magnetic shunt.

The conditions which generate an alarm to de-energize the training yard are the following trigger events, without limitation: closing of a fuse, failure to apply a bypass restriction, phase-to-ground fault to the yard training circuit, phase-to-phase fault to the yard training circuit, phase-to-ground fault through human contact with the yard training circuit, phase-to-phase fault through human contact with the yard training circuit, phase-to-ground or phase-to-phase fault through a cross arm or pole associated with the circuit, and phase-to-phase fault through contact between the yard training circuit and grounded physical structures in contact with the yard training circuit.

In one implementation, a high voltage training device is provided arranged of components housed within a device body, comprising a current limiting transformer; and a PLC in communication with a circuit transducer; a voltage transducer, and a safety relay; and an alarm system, wherein the device is configured to monitor a current of a yard circuit, detect a change in current of the yard circuit, indicating a trigger event, and cause engagement of the safety relay in response to the trigger event while simultaneously prompting the alarm system. In one particular implementation the device is configured according to International Electrotechnical Commission (IEC) criteria comprising IEC 61508 and IEC 62061. Each device may service up to nine (9) circuits per configured device, with each circuit up to nine monitored by the single device's PLC.

The current limiting transformer is a transformer configured to step the input voltage of the yard circuit from 120 VAC (primary) to 7200 VAC (secondary), comprising a shunt within the secondary coil to act as a current limiter to 0.060 Amps. In one implementation a transformer limits the current to 60 milliamps by means of a shunt, such as a magnetic shunt.

In one embodiment, the controller is a PLC configured to perform iterative monitoring of current of an energized training yard circuit and upon detection of a current greater than the threshold current is detected, subsequently control the opening of a safety relay in response to the increased current. Suitable controllers include the Simatic S7-1200F (by Siemens) and those other similar controllers, also featuring memory, programming compatibility, input cards and output cards. Ideal PLC processor scan times include bit operations of 0.08 µs/instruction; word operations of 1.7 µs/instruction; and real operations of: 2.3 µs/instruction. The PLC monitoring cycle rate is 500-1000 times per second, for monitoring of current rate transmitted to the PLC from the current sensor.

Safety relays are wired to meet International Standards Organization (ISO), IEC and safety level integrity (SIL) levels, including ISO 13849-1CAT4, and IEC 62061 SIL3 safety levels. Suitable safety relays include the Sirius relay (by Siemens) for autonomous safety applications enabling circuits 3 normally open (NO) contacts, with relay signaling circuit 1 normally closed (NC) contact equal to 24 volts AC/DC. In one implementation, the device safety relays and ratings include a fail-safe (on/off) SIL-3 (per IEC 61508); a safety relay (master) SIL-3 (per IEC 62061); and a safety relay (redundancy) SIL-3. In one embodiment, a safety relay configuration includes a release time of 20 ms, upon receiving a release signal from the controller in response of the trigger event.

The current transducer has an analog input incremental resolution comprising specifically a current of 0-5 A (rather than other ranges, such as 0-100), and an analog ADC of 13-bit, for an incremental resolution of $(5-0)(2^{13})=5/8192=0.0006$ A=600 µa increments, with analog outputs signals compatible with standard PLCs, data loggers and SCADA systems. The current transducer of the training device performs current monitoring as well as logging, together with the PLC. Suitable current transducer include those transducers such as the MCR passive current transducer (by Phoenix) for sinusoidal alternate currents measuring a range up to 5 A alternating current and converting sinusoidal alternate currents into analog standard signals up to 20 mA or 10 V.

In one implementation, the training device comprises a central processing unit (CPU) configured with an Ethernet port onboard used for upload/download of any PLC programming, and that can also be used to connect to other auxiliary devices including, but not limited to: data storage devices, a SCADA system, an Operator Workstation, a cloud-based server, for example. The system may also be configured with a virtual private network (VPN) that allows remote access to the system for programming and maintenance of one or more PLC software components, and to retrieve or download data logs. Data logging includes compiling records associated with trigger events, collecting and storing data related to variables, such as: time of event, date, current reading, voltage, time to open safety relay, phase event (A, B, or C), the resulting "event log" stored locally on the PLC or remotely on a database or other auxiliary device.

A control panel comprising one or more control buttons or switches relating to system operation is provided on the front panel and may be an arrangement of manual controls or digital controls. An LED or touch screen comprising a graphical user interface (GUI) or human machine interface (HMI) may also be included, to not only provide a visual display or read-out regarding the status or operation of the device, but to accept and implement the operator's control instructions, such as system initiation, safety pre-check, yard excitation, and shut down.

In one implementation, the high voltage training system is configured with one or more safety features and alarm systems, integrated, in part, with the system controller. Safety features include, without limitation: a main disconnect that allows simultaneous lock-out tag-out systems; a system reset and initialization requiring keyed-access; a High-Voltage Energize pushbutton protected by a padlock cover; an emergency stop pushbutton utilizing SIL-3 redundant sets of normally closed contacts, one of which is normally closed self-monitoring; a master safety relay that can only be reset upon keyed-access; one or more device panel (access) doors configured with coded magnetic door switches with SIL-3 redundant normally-closed (NC) contacts in line with the master safety relay; and physically isolating the high-voltage sources from low voltage. Also provided is a fault stop and alarm system to de-energizing the line, should the system detect more than 0.001 amperes of current in the yard circuit. One or more critical alarms trigger in response of one or more of the following conditions, without limitation: an incoming supply voltage out-of-range (generally 5-10%) as detected by the voltage transducer; a safety relay response and/or feedback time that is out of spec; a poor DC power supply; tripping of a transformer overcurrent protection; and lack of door safety switch.

In one implementation, the annunciation of critical alarms is carried out as follows: upon critical alarm event detection in self-check or safety pre-check mode of the system, the PLC will trigger a non-permissive mode, effectively shutting down until system diagnosis completed and the alarm is cleared; upon critical alarm event detection during system operation, a visual or audible alarm sounds, such as flashing light, beacon or horn alarm, for example at timed intervals to alert an operator, effectively putting the system in shut down until system diagnosis is complete. In another implementation, one or more non-critical alarms are provided, such as for overcurrent detection during system start-up, annunciated by audible horn or pilot light indicator, or a combination thereof.

In one implementation, the high voltage training system is configured for a pre-check operation performed prior to a training operation. The pre-check operation includes performing, within an allotted time period, a series of safety checks of system components, including but not limited: communications with the PLC, instrumentation, lights, and alarms systems. The system pre-check ensures a safer operational mode by initiating a system lock-out and preventing use of the system until any pre-check malfunctions have been identified and resolved.

Turning now to the figures, where various illustrative examples are shown. FIG. 1 shows a front view of a high voltage training device 100, according to one embodiment of the invention, wherein the device 100 is configured of a frame comprising a main device body 102 for housing internal electrical and mechanical components, supported by a pair of legs 104 that elevate the device to a readily accessible height for access by an operator. While the device is provided for purposes of illustration, it should be understood that other modifications and changes are contemplated, however. For instance, device legs 104, while useful for providing an elevated device for ease of access to internal components, are not necessary or required for operation of the device. The device may be configured as a stand-alone unit, or as a portable box-like structure which may in turn be mounted to a pole, table, or other stabilizing or stationary structure in the training yard. The device housing body 102 is generally rectangular in shape with a front panel, opposite side panels, a back panel, a top and a bottom, with an interior cavity formed therefrom wherein device components are arranged. Front panel of housing 102 comprises access doors 106 that when open expose internal components of the device 100 and permit access for system maintenance, etc. A magnetic safety switch 108 for securing doors 106 (safety features prior to energizing high voltage), an emergency stop switch 112, and a main disconnect 110 capable of three simultaneous lock-out-tag-out systems, are also shown. A receptacle 116 is shown positioned on a side panel of housing 102, for receiving a connection to an auxiliary device, such a laptop computer or other portable electronic device. The arrangement shown by FIG. 1 is a generally rectangular device unit with dimensions of 10-14 inches (W) 30-90 inches (H) by 50-70 inches (L), although depending on the configuration of components and materials used other dimensions are envisioned and the dimensions provided are not intended to be limiting.

Figure 2:
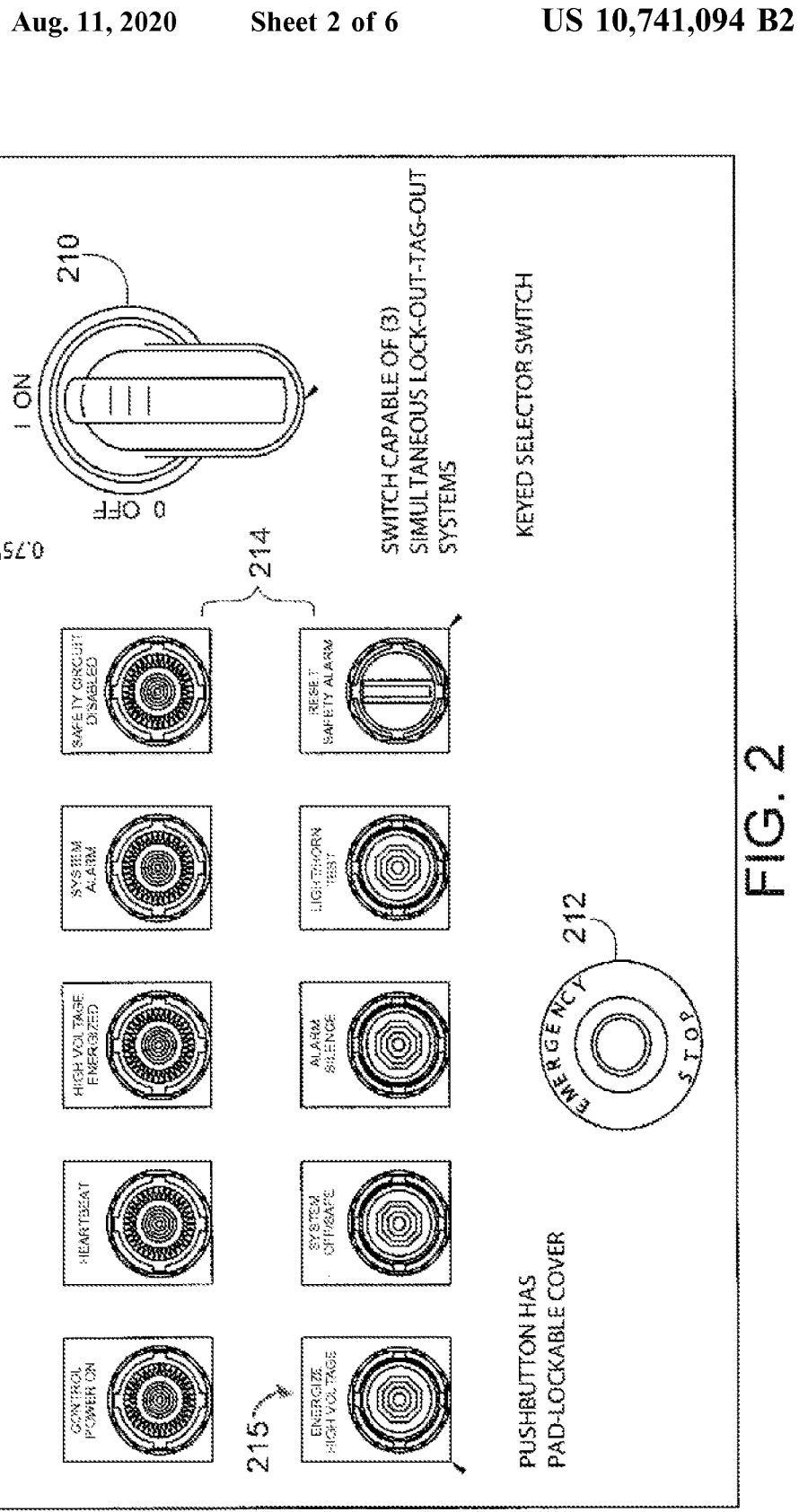
FIG. 2 shows an overview of a control panel of a high voltage training device according to one embodiment of the invention.

FIG. 2 shows a closer view of a front panel 200 of the high voltage training device according to another illustrative embodiment of the present invention, comprising a plurality of controls 214 corresponding to an operational state or function of the device. Controls 214 may be configured with a pilot light that illuminates when activated, and each control may be further configured with a padlock cover. Exemplary controls include, without limitation: a power control, a high voltage energized indicator, a system alarm indicator, a safety circuit disabled indicator, an Energize High Voltage pushbutton 215, a system safe, an alarm silence, a light/horn test, and a safety alarm reset. The controls may be configured as push button, as switches, or as dials; controls may also be presented as an LED or digital display panel, with touch-based controls. Controls may further include safety features, such as keyholes for secure keyed-access to the control. Also shown are the emergency stop control 212 and main disconnect control 210.

Figure 3:
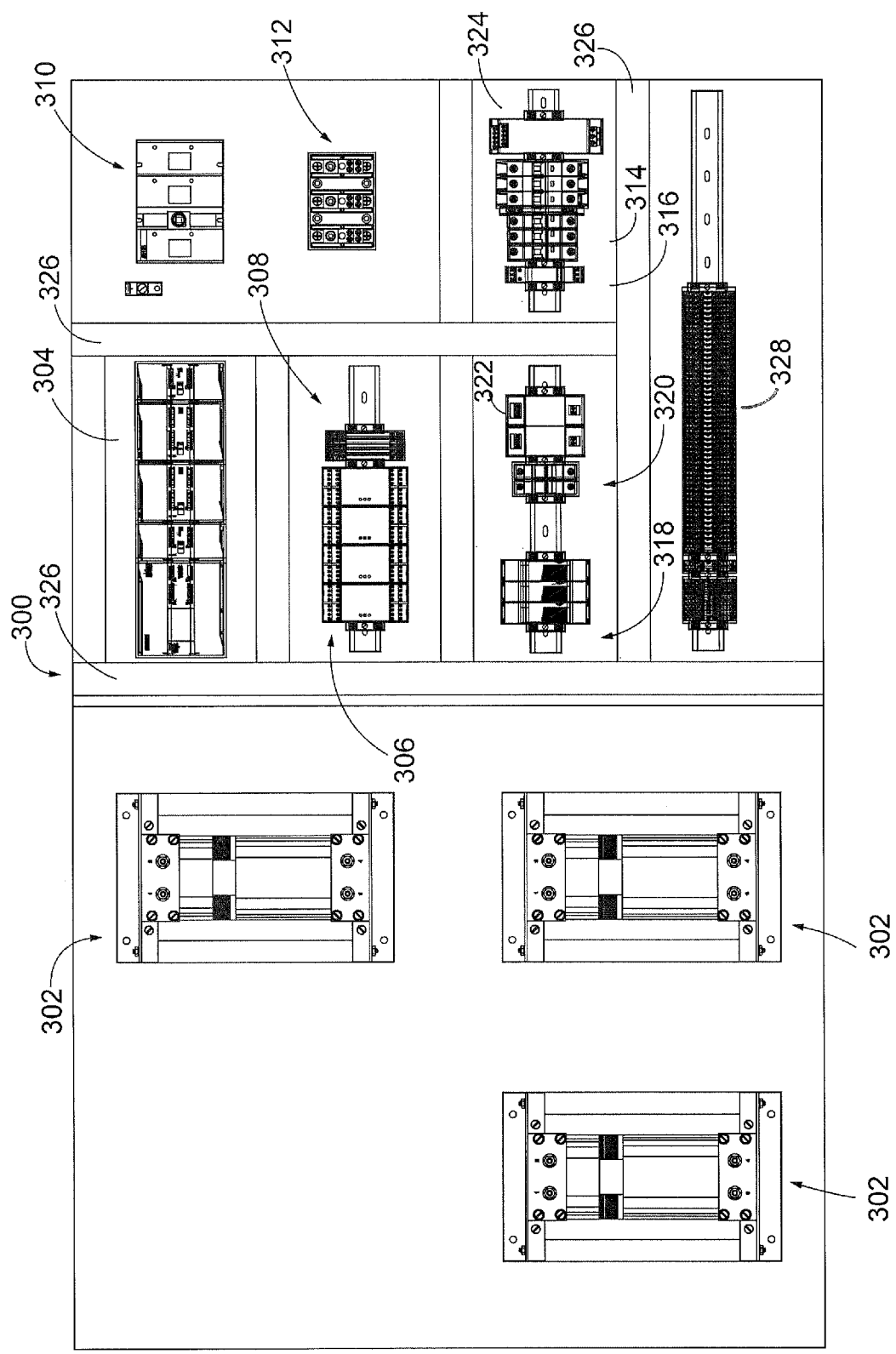
FIG. 3 shows an interior view of a high voltage training device according to one embodiment of the invention.

FIG. 3 shows a representative (expanded) view of an interior arrangement 300 of the high voltage training device, according to one illustrative embodiment. Shown arranged within the device are operational components, comprising: a current-limiting transformer 302, a controller (PLC) 304, a safety relay 306, a control relay 308, a disconnect switch 310, a power distribution block 312, a circuit breaker 314, a surge suppressor 316, a current transducer 318, a fuse 320, a voltage transducer 322, a power supply 324, a plurality of wire ways 326, and one or more terminal blocks 328 for connecting the device to the training yard. As previously described, the controller 304 is connected and receives signals from the current transducer 318 and voltage transducer 322, and also connected for sending and receiving signals with the control relay 308.

Figure 4:
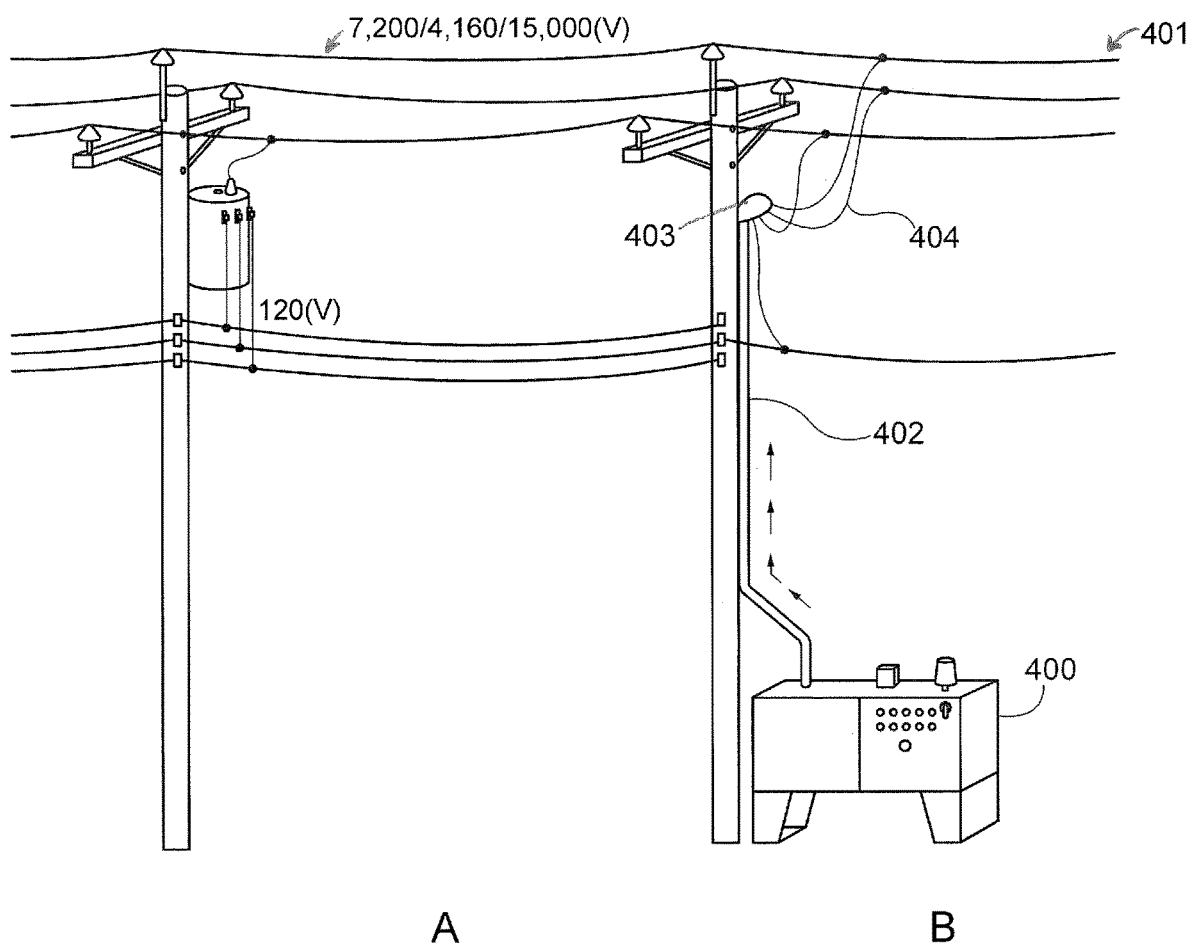
FIG. 4 shows an overview of a high voltage training system according to one embodiment of the invention.

FIG. 4 shows an overview of standard electrical wire arrangement (A) along with an illustrative high voltage training system environment (B), wherein the high voltage training device 400, via the current limiting transformer, energizes training lines wires 401 by aid of conduit 402, service mast 403 and line wire conduits 404. The high voltage device and energized training lines collectively form the training yard and training yard circuit.

Figure 5:
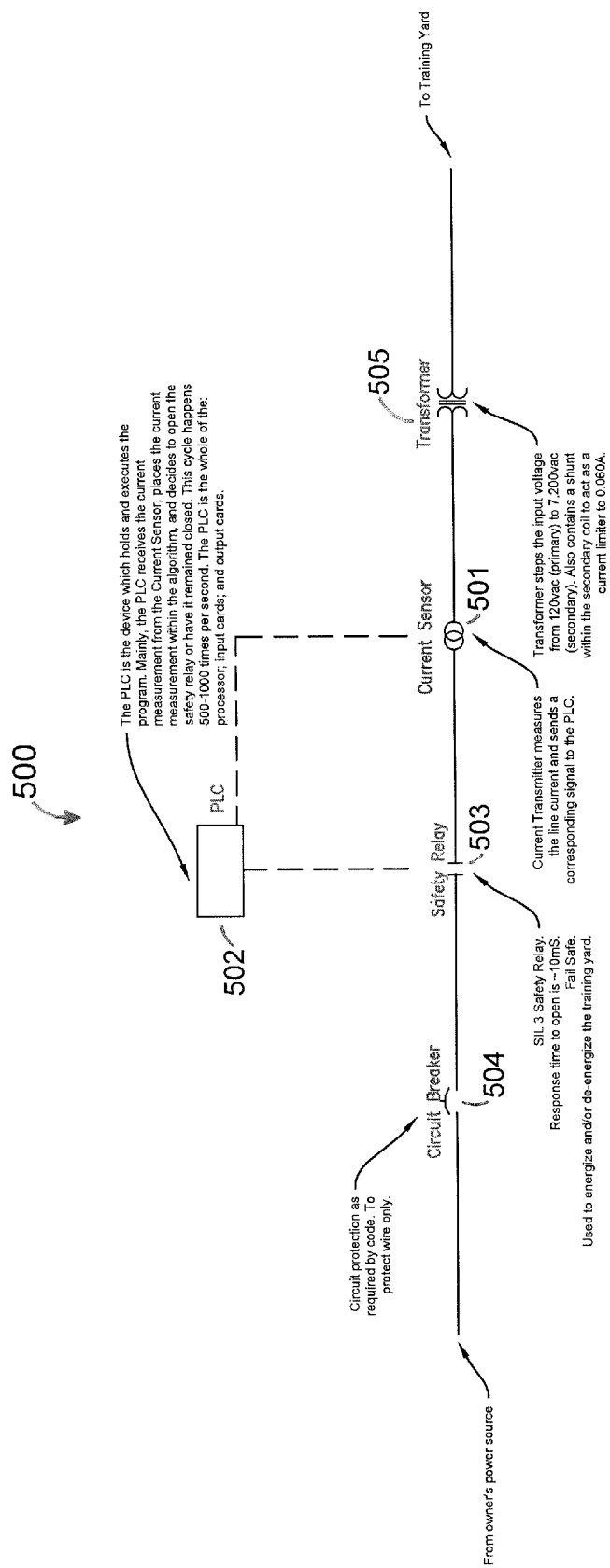
FIG. 5 shows a schematic overview of a yard circuit according to one embodiment of the invention.

FIG. 5 shows a schematic of a yard circuit 500 in a representative training operation comprising a current sensor 501, controller 502, safety relay 503, circuit breaker 504 and transformer 505. The training operation initiates following a safety pre-check, and at the time point of energizing the yard circuit. A line current flows from a power source to the training device, outward to the training yard (such as shown in FIG. 4). A current transducer (or sensor) 501 measures the line current of the system and transmits a corresponding current signal to the controller (PLC) 502. The controller 502 receives the signal and calculates a threshold current for the yard circuit, based on an excitation current (the base current of the wire) and a trip level (+/− variable), to establish the threshold current. For example: an excitation current of 10 mA, and a trip level of 1.5 generates a threshold value of 11.5 mA, thus any current reading greater than the threshold will presume to be a trigger event, causing the system to de-energize the circuit by signaling the safety relay 503 to open. Once the yard circuit assumes an energized state, one or more trainees may conduct training exercises with the energized lines of the yard circuit, while the training device continues to monitor the yard circuit for a trigger event, such as contact between a trainee and an energized line, detected by the device as a current rate exceeding the threshold.

Figure 6:
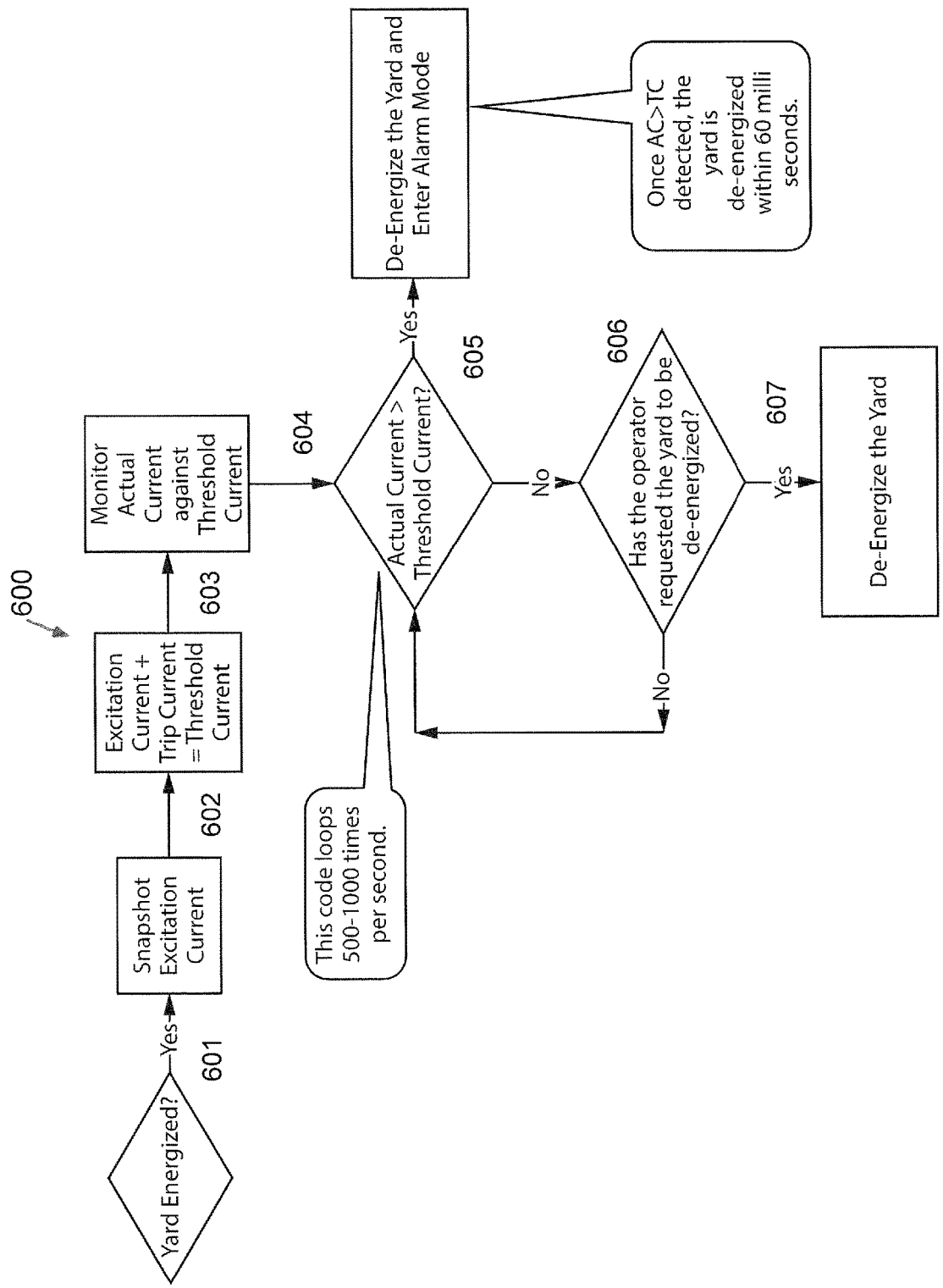
FIG. 6 shows an overview of a process for high voltage training using a high voltage training device according to one embodiment of the invention.

Shown in FIG. 6 is an overview of a current monitoring process 600 carried out by the high voltage training device, according to one embodiment of the invention. Upon confirmation that the circuit yard is energized (step 601) the controller collects a snapshot of the current at excitation (step 602), and then using the current at excitation, calculates a threshold current (step 603). The threshold current is stored by the controller for further calculation as the controller monitors the actual current of the yard circuit (as measured by the current transducer) is compared to the threshold current (step 604). Iteratively, the controller receives a signal from the current transducer and determines if the current is greater than the threshold current, with the comparison occurring in a loop at a rate of 500-1000 times per second. If the controller compares the actual current received by the current transducer to the threshold current, and if the value of the current signal received is greater than the threshold, the controller sends a signal to the safety relay to de-energize the mode (step 605), and the yard circuit is de-energized within 60 miliseconds. If the actual current is not greater than the threshold current, and there has been no request to de-energize the circuit (step 606), the monitoring cycle continues, until either a trigger event occurs (step 605), or an operator shuts down (de-energizes) the yard (step 607).

As certain implementations have been described and shown in detail in the drawings and foregoing description, the same is to be considered as illustrative and not restrictive in nature, it being understood that only the preferred embodiment has been shown and described and that all changes and modifications that come within the spirit and scope of this disclosure are desired to be protected. Optimum dimensional relationships for parts of the implementations discussed herein, including variations in size, materials, shape, form, function and manner of operation, assembly and use, and all equivalent relationships to those illustrated in the illustrations and described in the specification are intended to be encompassed by the appended claims.

What is claimed is:

1. A high-voltage training system, comprising:
   a training yard circuit to characterized by an excitation current less than operational current associated with high-voltage lines;
   at least one safety relay, current transducer, and current-limiting transformer, the foregoing being electrically connected in series in the training yard circuit;
   a controller programmed to receive input from at least one of the current transducer and the safety relay, and to provide output to the safety relay;
   wherein the current transducer is adapted to generate, in real time, an actual current signal corresponding to the actual current in the training yard circuit;
   wherein the controller is programmed with executable instructions to be capable of performing any of the following operations:
   (a) generating a threshold current value in response to receiving a signal corresponding to the excitation current;
   (b) receiving the actual current signal from the current transducer;

(c) comparing the actual current signal and the threshold current value;
(d) determining if the actual current exceeds the threshold current;
(e) determining if at least one of the current transducer and the safety relay remains operatively connected to the controller;
(f) causing the safety relay to de-actuate in response to a determination of at least one of the operations (d) and (e) above being affirmative, whereby the safety relay de-energizes the yard circuit;
wherein the safety relay is rated SIL-3 and adapted to de-energize the training yard circuit within 120 milliseconds of the controller de-actuating the safety relay.

2. The system of claim 1, wherein the current transducer generates the actual current signal to an accuracy of one-one-hundredth of a milliampere, and wherein the controller is suitably programmed to compare the actual current signal to the threshold current value at intervals not to exceed 10 milliseconds.

3. The system of claim 1, wherein the controller comprises an automation program module.

4. The system of claim 3, wherein the controller comprises a programmable logic controller (PLC) and wherein the automation program module resides within the PLC.

5. The system of claim 1 wherein the current-limiting transformer comprises primary and secondary coils and a shunt between the primary and secondary coils, the shunt configured to limit current exiting the secondary coil of the transformer to an amount not to exceed 60 millamperes.

6. The system of claim 1, wherein the controller is downloadable from a server to a portable client electronic device.

7. The system of claim 6, wherein the client electronic device is at least one selected from the group consisting of a computer, a tablet, and a smartphone.

8. The system of claim 1, further comprises an audible alarm, and wherein the controller is programmed with executable instructions to be capable of causing actuation of the audible alarm upon de-energizing of the yard training circuit.

9. The system of claim 1, wherein the transformer generates a voltage of 7200 volts in the yard training circuit, and wherein the transformer is characterized by an excitation current less than 50 milliamperes.

10. The system of claim 1, wherein the yard training circuit is a three-phase system.

11. The system of claim 1, wherein the yard training circuit includes a high-voltage portion characterized by an initial state of 7200 volts and an excitation current ranging between 1 milliamp and 20 milliamps, the excitation current being present in three phases.

12. The system of claim 11, wherein the system comprises three of the current transducers, one for each of the three phases, and wherein the controller is configured to receive phase current signals corresponding to the actual voltage from each of the three current transducers and to de-energize the yard in response to any one of the phase current signals exceeding the threshold current.

13. The system of claim 12, wherein the three current transducers are electrically connected to the high-voltage portion of the yard training circuit to generate actual current signals in excess of the threshold current whenever any of the following conditions occurs: closing of a fuse, failure to apply a in bypass restriction, phase-to-ground fault through the yard training circuit, phase-to-phase fault through the yard training circuit, phase-to-ground fault through human contact with the yard training circuit, phase-to-phase fault through human contact with the yard training circuit, phase-to-ground or phase-to-phase fault through a cross arm or a pole associated with the circuit, and phase-to-phase fault through contact between the yard training circuit and grounded physical structures in contact with the yard training circuit.

14. The system of claim 1, wherein the controller comprises a digital memory for logging data corresponding to a determination by the controller to cause the yard to de-energize.

15. A method of training high-voltage linesmen, the method of comprising:
allowing a linesman undergoing training to access energized wires and corresponding associated electric poles, of a training yard circuit the wires and poles simulating high-voltage field applications;
energizing the training yard circuit to an excitation current greater than 1 milliamp and less than 50 milliamps;
determining a threshold current corresponding to a current above the excitation current;
monitoring actual current in the circuit and comparing the actual current against the threshold current;
de-energizing the circuit in response to detecting the actual current exceeds the threshold current, the de-energizing occurring within 60 milliseconds of said detection.

16. The method of claim 15, wherein the circuit and associated poles are configured to permit access to the wires by a linesman's bucket, the method further comprising the step of detecting inadvertent contact between the bucket and the wires by detection of a corresponding ground fault.

17. The method of claim 15, further including the step of sounding an alarm upon de-energizing of the circuit.

18. The method of claim 15, further comprises logging data in a digital memory corresponding to de-energizing the yard circuit.

19. A device for modulating current in a training yard circuit, the device comprising:
at least one safety relay, current transducer, and current-limiting transformer configured to generate a voltage of 7200 volts in the yard circuit, and wherein the transformer is characterized by an excitation current less than 50 milliamperes, the foregoing safety relay, current transducer and current-limiting transformer being electrically connected in series;
a controller programmed to receive input from at least one of the current transducer and the safety relay, and to provide output to the safety relay;
wherein the current transducer is adapted to generate, in real time, an actual current signal corresponding to the actual current in the training yard circuit;
wherein the controller is programmable with executable instructions to be capable of performing any of the following operations:
(a) generating a threshold current value in response to receiving a signal corresponding to an excitation current to energize the yard circuit;
(b) receiving the actual current signal from the current transducer;
(c) comparing the actual current signal and the threshold current value;
(d) determining if the actual current exceeds the threshold current;
(e) determining if at least one of the current transducer and the safety relay remains operatively connected to the controller;

(f) causing the safety relay to de-actuate in response to a determination of at least one of the operations (d) and (e) above being affirmative, whereby the safety relay de-energizes the yard circuit;

wherein the safety relay is rated SIL-3 and adapted to de-energize the training yard circuit within 120 milliseconds of the controller de-actuating the safety relay.

20. The device of claim 19, wherein the current transducer is a series of three transducers electrically connected to a high-voltage portion of the yard circuit to generate actual current signals in excess of the threshold current whenever any of the following conditions occurs: closing of a fuse, failure to apply a in bypass restriction, phase-to-ground fault through the yard training circuit, phase-to-phase fault through the yard training circuit, phase-to-ground fault through human contact with the yard training circuit, phase-to-phase fault through human contact with the yard training circuit, phase-to-ground or phase-to-phase fault through a cross arm or a pole associated with the circuit, and phase-to-phase fault through contact between the yard training circuit and grounded physical structures in contact with the yard training circuit.

* * * * *